(12) United States Patent
Shioda

(10) Patent No.: US 7,764,126 B2
(45) Date of Patent: Jul. 27, 2010

(54) CLOCK GENERATION CIRCUIT AND CLOCK GENERATION CONTROL CIRCUIT

(75) Inventor: Shinobu Shioda, Ora-gun (JP)

(73) Assignees: Sanyo Electric Co., Ltd., Moriguchi-shi (JP); Sanyo Semiconductor Co., Ltd., Gunma (JP)

(*) Notice: Subject to any disclaimer, the term of this patent is extended or adjusted under 35 U.S.C. 154(b) by 15 days.

(21) Appl. No.: 12/145,668

(22) Filed: Jun. 25, 2008

(65) Prior Publication Data

US 2009/0051450 A1    Feb. 26, 2009

(30) Foreign Application Priority Data

Jun. 25, 2007 (JP) ............................ 2007-166702
Jul. 5, 2007 (JP) ............................ 2007-177643

(51) Int. Cl.
*H03L 7/181* (2006.01)
*H03L 7/189* (2006.01)

(52) U.S. Cl. ............................ 331/16; 331/17; 331/34

(58) Field of Classification Search ................. 331/16, 331/17, 34
See application file for complete search history.

(56) References Cited

U.S. PATENT DOCUMENTS 6,885,252 B2 * 4/2005 Hsu ............................ 331/17
7,271,631 B2 * 9/2007 Watanabe ................... 327/115

FOREIGN PATENT DOCUMENTS

JP    08-316826    11/1996
JP    2000-188542   7/2000

* cited by examiner

*Primary Examiner*—Robert Pascal
*Assistant Examiner*—James E Goodley
(74) *Attorney, Agent, or Firm*—Westerman, Hattori, Daniels & Adrian, LLP

(57) ABSTRACT

According to a preferred embodiment, a clock signal generation circuit includes an oscillating circuit configured to output a clock signal having a clock frequency corresponding to a control signal, a counter configured to generate a count value by counting a pulse number of the clock signal outputted from the oscillating circuit during a predetermined time period, a subtracting circuit configured to produce differential data by subtracting the count value from a preset value previously set based on a predetermined clock frequency, a control signal correcting circuit configured to generate a correcting control signal by correcting a value of the control signal based on the differential data, and a digital-analog converter circuit configured to convert the correcting control signal into an analog correcting control signal and output the converted analog correcting control signal to the oscillating circuit. This clock signal generation circuit can prevent increasing of the circuit size or the system size due to a resistor, a capacitor element, etc., used in a PLL (Phase Locked Loop) without using a central processing unit.

12 Claims, 4 Drawing Sheets

CLOCK GENERATION CIRCUIT AND CLOCK GENERATION CONTROL CIRCUIT

This application claims priority under 35 U.S.C. §119 to Japanese Patent Application No. 2007-166702 filed on Jun. 25, 2007, and Japanese Patent Application No. 2007-177643 filed on Jul. 5, 2007, the entire disclosures of which are incorporated herein by reference in their entireties.

BACKGROUND OF THE INVENTION

1. Field of the Invention

The present invention relates to a clock signal generation circuit for generating a clock signal corresponding to a preset frequency, and also relates to a clock signal generation control circuit for controlling an oscillating circuit so that the oscillating circuit generates a clock signal corresponding to a preset frequency.

2. Description of the Related Art

The following description sets forth the inventor's knowledge of related art and problems therein and should not be construed as an admission of knowledge in the prior art.

FIG. 6 is a block diagram of a digital clock signal generation circuit 100 according to the related art. This clock signal generation circuit 100 includes an oscillating circuit 122, a counter 104, a central processing unit (CPU) 130, and a digital-analog converter (DAC) 116.

The oscillating circuit 122 is configured to generate a clock signal CLK having a preset frequency in accordance with a control signal outputted from the digital-analog converter (DAC) 116. This oscillating circuit 122 can be constituted by, for example, a voltage-controlled oscillator (VCO) and generates a clock signal having a frequency corresponding to a voltage signal outputted from the digital-analog converter (DAC) 116.

The counter 104 counts the pulse number of the clock signal outputted from the oscillating circuit 122. This counter 104 counts the pulse number inputted in, for example, one second under the control of a control circuit (not illustrated) and outputs the count value to the central processing unit (CPU) 130.

The central processing unit (CPU) 130 includes a register 132 for storing the preset value of the clock frequency and outputs a digital control signal for controlling the oscillating circuit 122 based on the count value outputted from the counter 104 and the preset value stored in the register 132. The central processing unit (CPU) 130 calculates, for example, the difference between the count value outputted from the counter 104 and the preset value stored in the register 132 and generates a control signal corresponding to the difference. Also, the central processing unit (CPU) 130 is configured to control the operation of various peripheral circuits (not illustrated) connected to the clock signal generation circuit 100 based on a predetermined control program.

A digital-analog converter (DAC) 116 converts the digital control signal outputted from the central processing unit (CPU) 130 into an analog signal and outputs the converted analog signal to the oscillating circuit 122.

As explained above, the clock signal generation circuit 100 is a digital clock signal generation circuit in which the counter 104 counts the pulse number of the clock signal and the central processing unit (CPU) 130 generates a control signal based on the count value.

FIG. 7 shows a block diagram of an analog type clock signal generation circuit 200 according to the related art. This clock signal generation circuit 200 includes an oscillating circuit 222, a frequency dividing circuit 208, a phase comparison circuit 202, a charge pump circuit (CP) 204, and a low pass filter (LPF) 206.

The oscillating circuit 222 generates a clock signal having a predetermined frequency depending on the control signal outputted from the low pass filter (LPF) 206. The oscillating circuit 222 can be constituted by, for example, a voltage-controlled oscillator and generates a clock signal CLK in accordance with the voltage signal outputted form the low pass filter (LPF) 206.

The frequency dividing circuit 208 divides the clock signal CLK outputted from the oscillating circuit 222 and outputs the signal to a phase comparison circuit 202. The phase comparison circuit 202 compares the clock signal outputted from the frequency dividing circuit 208 and a reference clock signal, and outputs the comparison result to the charge pump circuit (CP) 204 which will be detailed below. The reference clock signal can be, for example, a clock signal outputted from a crystal oscillator (not illustrated). This clock signal generation circuit 200 generates a clock signal corresponding to the frequency of the reference clock signal and the frequency division setting of the frequency dividing circuit 208.

Based on the comparison result of the phase comparison circuit 202, the charge pump circuit (CP) 204 selectively outputs a high-level voltage signal (e.g., 3.3 V) or a low-level voltage signal (e.g., 0 V).

The low pass filter (LPF) 206 includes a resistor element R and a capacitor C. One end terminal of the resistor element R is connected to the charge pump circuit (CP) 204 and the other end thereof is connected to the oscillating circuit 222. One end terminal of the capacitor C is connected to the connection point of the oscillating circuit 222 and the resistor element R, and the other end thereof is connected to the ground. This low pass filter (LPF) 206 smoothes the pulse signal outputted from the charge pump circuit (CP) 204 and outputs the smoothed signal to the oscillating circuit 222.

As explained above, this clock signal generation circuit 200 is an analog type clock signal generation circuit that generates a control signal by the charge pump circuit (CP) 204 and the low pass filter (LPF) 206 based on the comparison result of the phase comparison circuit 202.

In the case of using the clock signal generation circuit 100 shown in FIG. 6, the central processing unit (CPU) 130 controls the frequency of the clock signal outputted from the oscillating circuit 122, resulting in increased burden of the central processing unit (CPU) 130. That is, since the central processing unit (CPU) 130 also controls operation of the peripheral circuits connected to the clock signal generation circuit 100, as the load increases, the operation speed of the entire system having the clock signal generation circuit 100 will be deteriorated.

As a method for decreasing the burden of the central processing unit (CPU), it can be considered to use a clock signal generation circuit 200 as shown in FIG. 7. This clock signal generation circuit 200 is an analog type clock signal generation circuit and therefore the frequency of the clock signal can be controlled without using a central processing unit CPU. In the case of generating a clock signal having a relatively low frequency (e.g., 40 kHz), it is required to use a high capacitance capacitor C or a large-resistance resistor R constituting the low pass filter (LPF) 206. This increases the size of the capacitor C and/or that of the resistor R, which in turn increases the size of the clock signal generation circuit 200 and/or the size of the system mounting the clock signal generation circuit 200.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a clock signal generation circuit capable of decreasing a burden of a central processing unit (CPU) and restraining increase of a circuit size or a system size.

Among other potential advantages, some embodiments can provide a clock signal generation control circuit capable of controlling generation of a clock signal in accordance with a preset frequency without giving a burden on a central processing circuit (CPU).

According to a first aspect of the present invention, a clock signal generation circuit, includes:

an oscillating circuit configured to output a clock signal having a clock frequency corresponding to a control signal;

a counter configured to generate a count value by counting a pulse number of the clock signal outputted from the oscillating circuit during a predetermined time period;

a subtracting circuit configured to produce differential data by subtracting the count value from a preset value previously set based on a predetermined clock frequency;

a control signal correcting circuit configured to generate a correcting control signal by correcting a value of the control signal based on the differential data; and a digital-analog converter circuit configured to convert the correcting control signal into an analog correcting control signal and output the converted analog correcting control signal to the oscillating circuit.

With this first aspect of the present invention, even in an electronic circuit system equipped with the clock signal generation circuit, a peripheral circuit connected to the clock signal generation circuit and a central processing unit for controlling the peripheral circuit, this clock signal generation circuit is independent and therefore not required to be controlled by the central processing unit. This decreases the burden of the central processing unit and restrain increasing of the circuit size or the system size.

According to a second aspect of the present invention, a clock signal generation control circuit to be connected to an oscillating circuit for outputting a clock signal having a clock frequency corresponding to a control signal and a frequency control circuit for generating the control signal, wherein the clock signal generation control circuit includes:

a counter configured to count a pulse number of the clock signal outputted from the oscillating circuit during a predetermine time period and change an output level of a count control signal when a count value becomes equal to a preset value corresponding to the clock frequency; and an error detection circuit configured to detect a timing error between a timing signal indicating the predetermined time period and the count control signal and output an error detection signal, and wherein the frequency control circuit generates the control signal based on the error detection signal.

With this second aspect of the present invention, even in an electronic circuit system equipped with a clock signal generation circuit including the clock signal generation control circuit, a peripheral circuit connected to the clock signal generation circuit and a central processing unit for controlling the peripheral circuit, this clock signal generation circuit is independent and therefore not required to be controlled by the central processing unit. This enables controlling of the clock signal generation in accordance with the preset frequency without placing any burden on the central processing unit, which in turn can prevent increase of the system circuit size or the system size.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
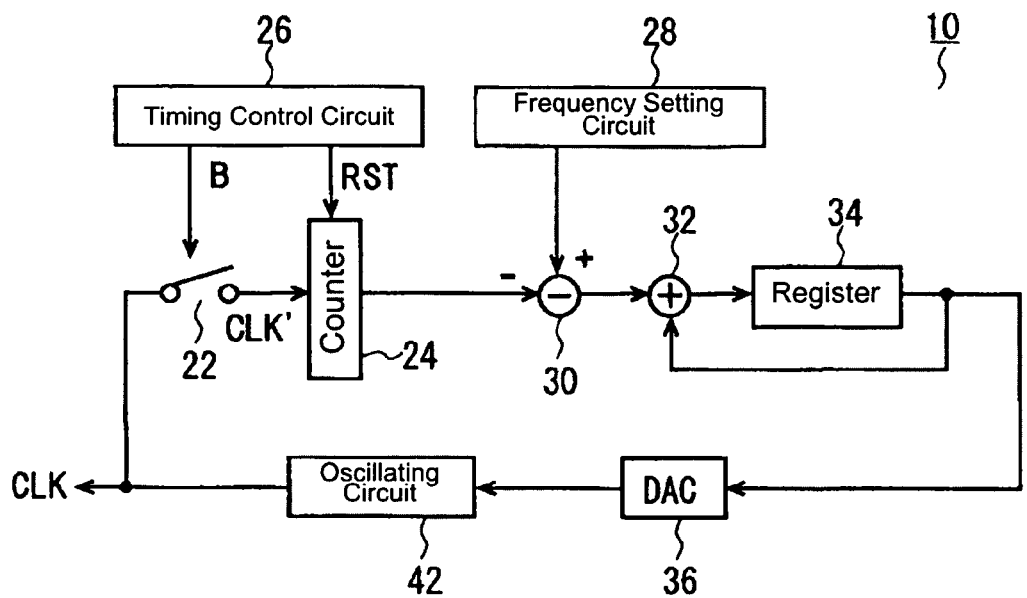
FIG. 1 is a schematic block diagram of a clock signal generation circuit according to a first embodiment of the present invention.

FIG. 1 is a schematic block diagram of a clock signal generation circuit 10 according to a first embodiment of the present invention. This clock signal generation circuit 10 is equipped with an oscillating circuit 42, a switch 22, and a counter 24, a timing control circuit 26, a frequency setting circuit 28, a subtracting circuit 30, and an adding circuit 32, a register 34, and a digital-analog converting circuit 36.

The oscillating circuit 42 generates a clock signal CLK in accordance with a control signal outputted from the digital-analog converting circuit (DAC) 36. This oscillating circuit 42 can be constituted by, for example, a voltage-controlled oscillator for generating a clock signal CLK having a frequency corresponding to a voltage signal outputted from the digital-analog converting circuit (DAC) 36.

The switch 22 is connected to the oscillating circuit 42 and the counter 24 to control whether the clock signal CLK is outputted to the counter 24. This switch 22 is on/off-controlled based on the timing signal B outputted from the timing control circuit 26 to extract the clock signal CLK inputted during the ON-period of the switch 22 and output the extracted clock signal CLK'.

The counter 24 is connected to the switch 22 and the subtracting circuit 30 to generate a count value by counting the pulse number of the extracted clock signal CLK' outputted from the switch 22. The counter 24 initiates counting of the pulse number of the extracted clock signal CLK' in accordance with the reset signal RST as a trigger outputted from the timing control circuit 26 which will be detailed. In other words, this counter 24 initiates/terminates the count operation in synchronization with the on-off timing of the switch 22.

The timing control circuit 26 executes on-off control of the switch 22 and also executes initiation/termination control of the count operation of the counter 24. This timing control circuit 26 outputs a timing signal B for executing the on-off control of the switch 22 and also outputs a reset signal RST for initiating the count operation to the counter 24.

The frequency setting circuit 28 can include, for example, a register for storing a preset value having a frequency of a clock signal CLK to be outputted from the clock signal generation circuit CLK. The preset value to be stored in the frequency setting circuit 28 can be any value corresponding to a frequency falling within a frequency range in which the oscillating circuit 42 can oscillate. The preset value to be stored in the frequency setting circuit 28 is preferably set to a pulse number of a clock signal CLK corresponding to the preset frequency based on the time information of the timing signal B outputted from the timing control circuit 26. For example, in cases where the clock signal control circuit 10 outputs a clock signal CLK having a frequency of 40 kHz and the timing control circuit 26 outputs a timing signal B which keeps a high level for one second, a digital value corresponding to "40,000" is stored in the frequency setting circuit 28.

The subtracting circuit 30 calculates the difference between the preset value stored in the frequency setting circuit 28 and the count value outputted from the counter 24. When the frequency of the clock signal CLK is higher than the frequency set in the frequency setting circuit 28, the count value becomes larger than the preset value. As a result, the subtracting circuit 30 outputs a negative value. To the contrary, when the frequency of the clock signal CLK is lower than the frequency set in the frequency setting circuit 28, the count value becomes smaller than the preset value. As a result, the subtracting circuit 30 outputs a positive value.

The adding circuit 32 adds the difference outputted from the subtracting circuit 30 and the control value previously stored in the register 34. The register 34 temporarily stores the sum value generated by the adding circuit 32 as a control signal value for controlling the oscillating frequency of the oscillating circuit 42. In other words, the adding circuit 32 adds the data showing the error of the clock signal CLK generated by the counter 24 and the subtracting circuit 30 to the control value stored in the register 34 to update the control value for controlling the oscillating circuit 42 and store the updated control value.

It is preferable that the timing control circuit 26 outputs the reset signal RST at the timing corresponding to the operation of the adding circuit 32 and the register 34. In other words, the timing control circuit 26 outputs the reset signal RST after the updating of the control value of the oscillating frequency by the adding circuit 32 and storing of the updated control value in the register 34.

The digital-analog converting circuit 36 converts the digital control value stored in the register 34 into an analog signal and outputs the analog signal to the oscillating circuit 42. At this time, it is preferable that the digital-analog converting circuit (DAC) 36 has characteristic of converting the control value stored in the register 34 into an analog value appropriate to the oscillating circuit 42.

Next, the operation of the clock signal generation circuit 10 of this first embodiment will be explained.

Figure 2:
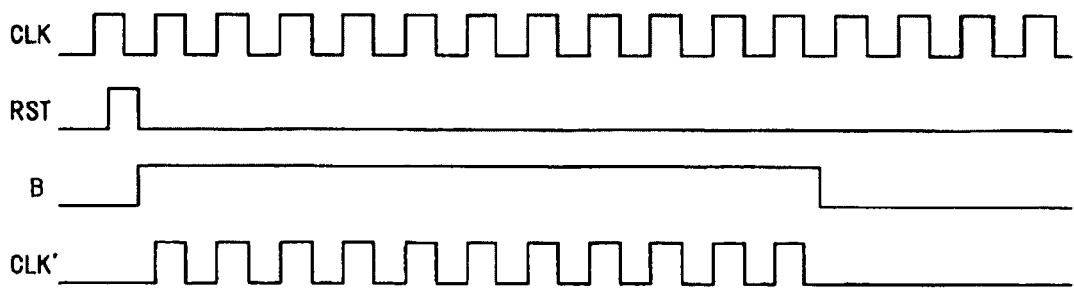
FIG. 2 is a timing chart showing an operation timing of the clock signal generation circuit of the first embodiment.

FIG. 2 is a timing chart showing the operation timing of the clock signal generation circuit 10 of this first embodiment. In the example shown in FIG. 2, the timing control circuit 26 outputs a timing signal B keeping a high level for one second, the frequency setting circuit 28 stores "12" as the preset value, and the clock signal generation circuit 10 is controlled so as to output a clock signal CLK of 12 Hz.

The timing control circuit 26 outputs a reset pulse as a reset signal RST to the counter 24. With this reset signal, the counter 24 returns to its initial state. Upon change of the reset signal RST from a high level signal to a low level signal, the counter 24 initiates the count operation. At this time, the timing signal B changes from a low level signal to a high level signal. The switch 22 keeps an ON-state during the high level period of the timing signal B and outputs the clock signal CLK inputted during the period as a clock signal CLK'.

The counter 24 counts the pulse number of the inputted clock signal CLK'. In the example shown in FIG. 2, during the high level period of the timing signal B, the clock signal CLK' includes clock signals of 11 (eleven) cycles. The counter 24 counts the pulse number of the clock signal of 11 (eleven) cycles and outputs the count value to the subtracting circuit 30. For example, the subtracting circuit 30 subtracts the count value "11" from the preset value "12" stored in the frequency setting circuit 28, and outputs the difference "+1" to the adding circuit 32.

The adding circuit 32 adds the difference "+1" outputted from the subtracting circuit 30 to the control value stored in the register 34 and stores the sum value in the register 34 as a new control signal. In detail, since the current frequency of the clock signal CLK is lower than the preset frequency, it is controlled so as to increase the frequency of the clock signal CLK by increasing the value of the control signal for controlling the oscillating circuit 42.

When the frequency of the clock signal CLK is higher than the preset frequency, the subtracting circuit 30 outputs a negative value as the difference. As a result, the adding circuit 32 decreases the value of the control signal to be stored in the register 34 to thereby control the frequency of the clock signal CLK so as to be decreased.

In an electronic circuit system having a central processing circuit (CPU) and the clock signal generation circuit 10 of this first embodiment, a clock signal frequency control can be performed with a high degree of accuracy without using a central processing circuit (CPU). Accordingly, in such a system having the clock signal generation circuit 10, it becomes possible to reduce the burden of the central processing unit (CPU), thereby preventing adverse affects on operation of the entire system.

Figure 7:
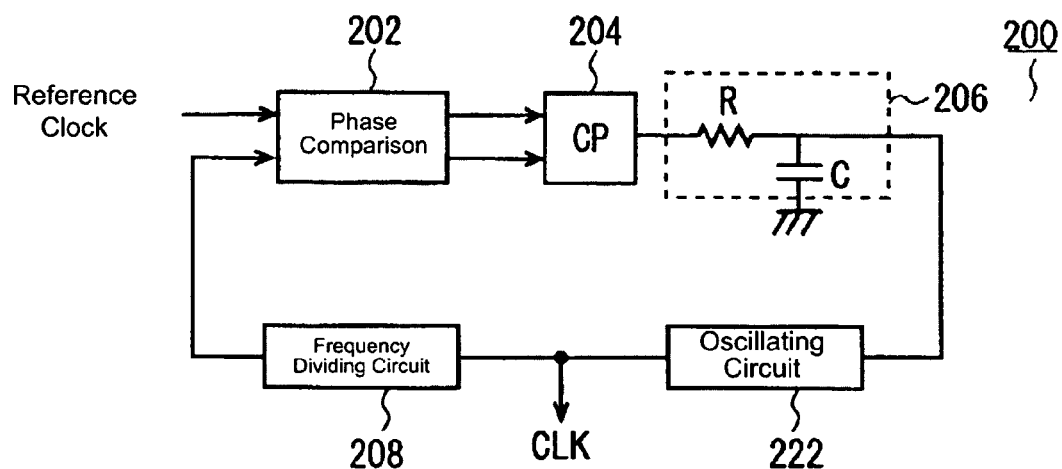
FIG. 7 is another schematic block diagram of a clock signal control circuit according to the related art.

Furthermore, according to the first embodiment, the clock signal generation circuit 10 is not equipped with a low pass filter (LPF) 206 as shown in FIG. 7. Therefore, even in the case of generating a low frequency clock signal, it is not required to use a capacitor large in capacitance and/or a resistor large in resistance for a low pass filter (LPF). This can prevent enlarging of the circuit size of the clock signal generation circuit 10 and enlarging of the size of the system having the clock signal generation circuit 10.

The above-mentioned first embodiment is configured such that, using the switch 22 and the counter 24, the pulse number of the clock signal CLK contained in a predetermined time period (1 second) is counted. The present invention, however, is not limited to this embodiment. For example, the timing control circuit 26 can be constituted so as to output a reset signal RST and a holding signal for terminating the count operation and holding the count value to the counter. This invention can be exercised, without using the switch 22, by outputting a reset signal RST from the timing control circuit 26 and then outputting a holding signal from the timing control circuit 26 after completion of the counting.

The operation of the switch 22 and the counter 24 in the first embodiment is one example of the present invention, and the present invention is not limited to this operation. For example, it is not always required to perform the reset operation of the counter 24 immediately before the count initiation. The reset operation can be performed during a no-count operation period. Furthermore, it can be constituted such that the rest operation of the counter 24 is performed after a time corresponding to the predetermined number of pulses has passed from the count termination.

Furthermore, in the present invention, it can be constituted such that a clock signal CLK is inputted into a frequency dividing circuit (not illustrated) and the counter 24 counts the pulse number of the frequency-divided clock signal CLK. This enables a low speed operation of the counter 24, which does not require the use of a high-precision counter as the counter 24. This in turn can reduce the cost of the clock signal generation circuit 10 and the system mounting the circuit 10.

Furthermore, in this embodiment, the digital-analog converting circuit (DAC) 36 has a function of converting the control signal stored in the register 34 into an analog signal suitable to the oscillating circuit 42, but the present invention is not limited thereto. For example, it can be constituted such that the function can be divided into a function of converting the control signal into a digital value suitable to the oscillating circuit 42 and a function of converting the converted digital signal into an analog signal.

Next, a second embodiment of the present invention will be explained.

Figure 3:
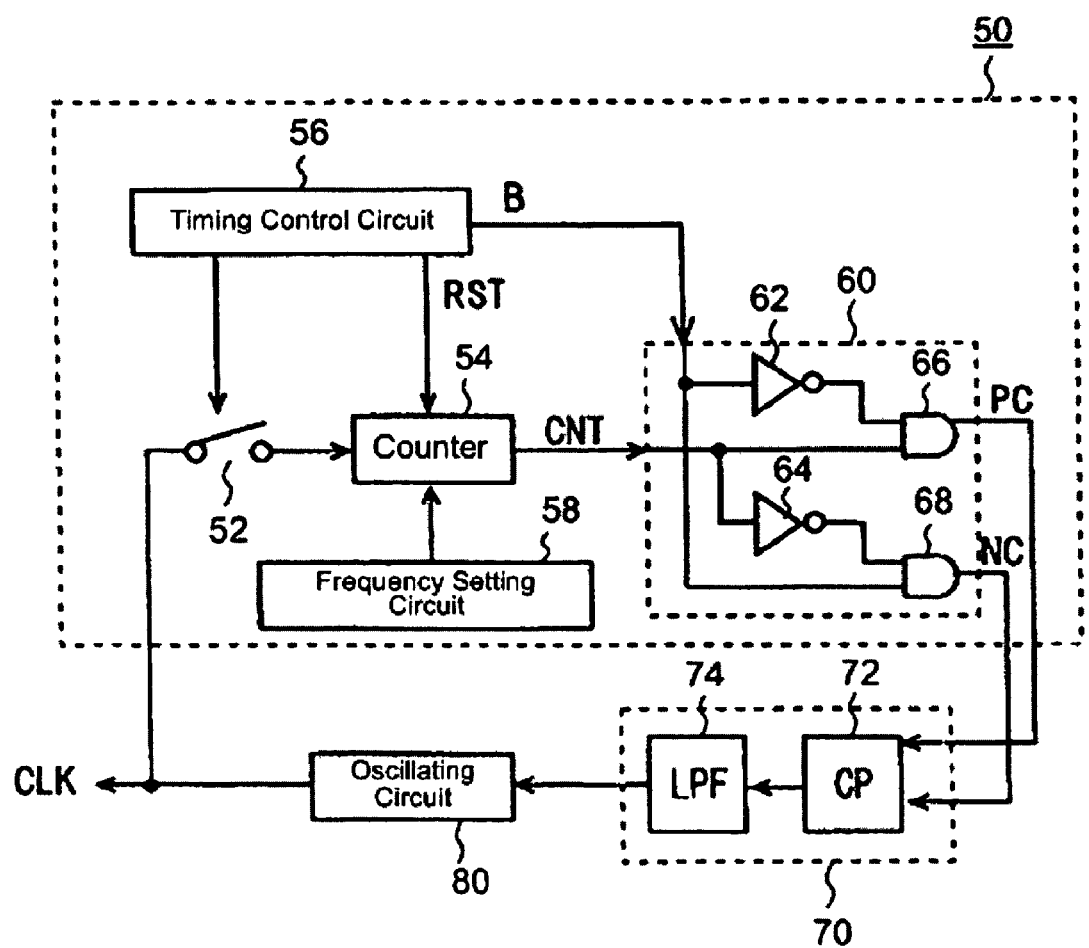
FIG. 3 is a schematic block diagram of a clock signal generation control circuit according to a second embodiment of the present invention.

FIG. 3 is a schematic block diagram showing a clock signal generation control circuit 50 according to the second embodiment of the present invention. The clock signal generation control circuit 50 is provided with a switch 52, a counter 54, a timing control circuit 56, a frequency setting circuit 58, and an error detection circuit 60. The clock signal generation control circuit 50 is connected to an oscillating circuit 80 and a frequency control circuit 70 to form a clock signal generation system.

The oscillating circuit 80 generates a clock signal CLK in accordance with a control signal outputted from the frequency control circuit 70. The oscillating circuit 80 can be constituted by, for example, a voltage-controlled oscillator (VOC) for generating a clock signal CLK having a frequency corresponding to a voltage signal outputted from the frequency control circuit 70.

The switch 52 is connected to the oscillating circuit 80 and the counter 54 and controls whether the clock signal CLK is to be outputted to the counter 54. This switch 52 is on/off-controlled based on a control signal outputted from the timing control circuit 56 to extract the clock signal CLK inputted during the ON-period of the switch 52 and output the extracted clock signal.

The counter 54 is connected to the switch 52 and the error detection circuit 60 to count the pulse number of the clock signal CLK outputted from the switch 52 and output a count control signal CNT in accordance with the count value. The counter 54 changes the count control signal CNT from a low level to a high level upon initiation of the count operation, and changes the count control signal CNT from the high level to a low lever when the count value becomes equal to the preset value set by the frequency setting circuit 58.

It is preferable that this counter 54 is a down counter for performing countdown operation of the preset value as an initial value set by the frequency setting circuit 58. In this case, the counter 54 changes the count control signal CNT from the high level to the low level when the count value becomes "0."

The timing control circuit 56 performs on-off control of the switch 52 and also control initiation/termination of the count operation of the counter 54. The timing control circuit 56 outputs a timing signal B showing a predetermined time period to the error detection circuit 60 which will be detailed and also outputs a reset signal RST for initiating the count operation of the counter 54.

The frequency setting circuit 58 can include, for example, a register to store a preset value corresponding to the frequency of the clock signal CLK to be outputted from the oscillating circuit 80. The preset value to be stored in the frequency setting circuit 58 can be any value having a frequency falling within a frequency range in which the oscillating circuit 80 can oscillate. The preset value to be stored in the frequency setting circuit 58 is preferably set to a pulse number of a clock signal CLK corresponding to the preset frequency based on the time information of the timing signal B outputted from the timing control circuit 56. For example, in cases where the clock signal generation control circuit 50 controls the oscillating circuit 80 so as to output a clock signal CLK having a frequency of 40 kHz and the timing control circuit 56 outputs a timing signal B which keeps a high level for one second, a digital value corresponding to "40,000" is stored in the frequency setting circuit 58.

The error detection circuit 60 detects an error between the timing signal B and the count control signal CNT, generates and outputs a positive side error signal PC and a negative side error signal NC depending on the detected result. When the frequency of the clock signal CLK is higher than the preset frequency of the clock signal CLK, the error detection circuit 60 outputs a negative side error detection signal NC which keeps a high level during a predetermined time period. On the other hand, when the frequency of the clock signal CLK is lower than the preset frequency of the clock signal CLK, the error detection circuit 60 outputs a positive side error detection signal PC which keeps a high level during a predetermined time period. In this second embodiment, the error detection circuit 60 includes NOT elements 62 and 64 and AND elements 66 and 68.

The NOT element 62 inverts the timing signal B and then inputs the inverted signal to one input terminal of the AND element 66. The NOT element 64 inverts the count control signal CNT and then inputs the inverted signal to one input terminal of the AND element 68. The output of the NOT element 62 is inputted to one input terminal of the AND element 66 and the count control signal CNT is inputted to the other input terminal of the AND element 66. The AND element 66 outputs the calculation result as a positive side error detection signal PC. The output of the NOT element 64 is inputted to one input terminal of the AND element 68 and the timing signal B is inputted to the other input terminal of the AND element 68. The AND element 68 outputs the calculation result as a negative side error detection signal NC.

The frequency control circuit 70 generates and outputs a signal for controlling the frequency of the clock signal CLK to be generated by the oscillating circuit 80 based on the positive side error detection signal PC and the negative side error detection signal NC outputted from the error detection circuit 60. In this second embodiment, the frequency control circuit 70 is provided with a charge pump circuit (CP) 72 and a low pass filter (LPF) 74.

The charge pump circuit (CP) 72 selectively outputs a high level voltage signal (e.g., 3.3 V) or a low level voltage signal (e.g., 0 V) depending on the positive side error detection signal PC and the negative error detection signal NC. When the positive error detection signal PC is a high level signal, the charge pump circuit (CP) 72 outputs a high level voltage signal. On the other hand, when the negative error detection signal NC is a high level signal, the charge pump circuit (CP) 72 outputs a low level voltage signal. The low pass filter (LPF) 74 includes a capacitor (not illustrated) and smoothes the pulse-like signal outputted from the charge pump circuit (CP) 72 to output the smoothed signal to the oscillating circuit 80. In other words, the capacitor constituting the low pass filter (LPF) 74 will be charged when the positive side error detection signal PC is a high level signal and discharged when the negative side error detection signal NC is a low level signal.

Next, the operation of this clock signal generation control circuit of this second embodiment will be explained.

Figure 4:
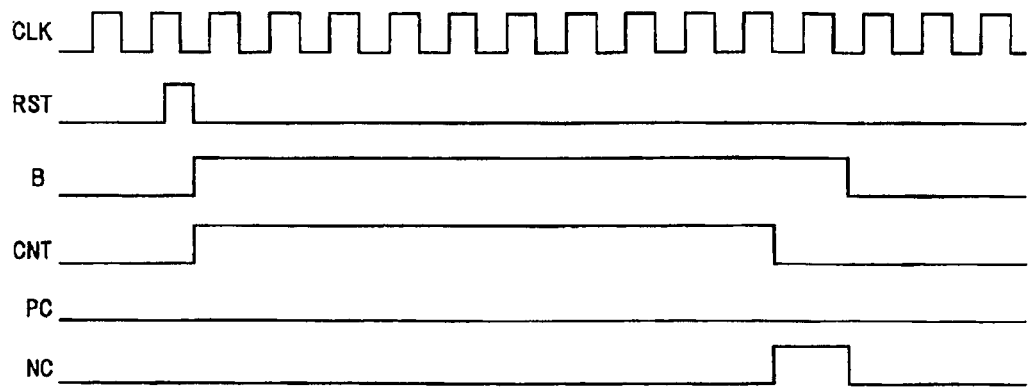
FIG. 4 is a timing chart showing an operation timing of the clock signal generation control circuit of the second embodiment.
Figure 5:
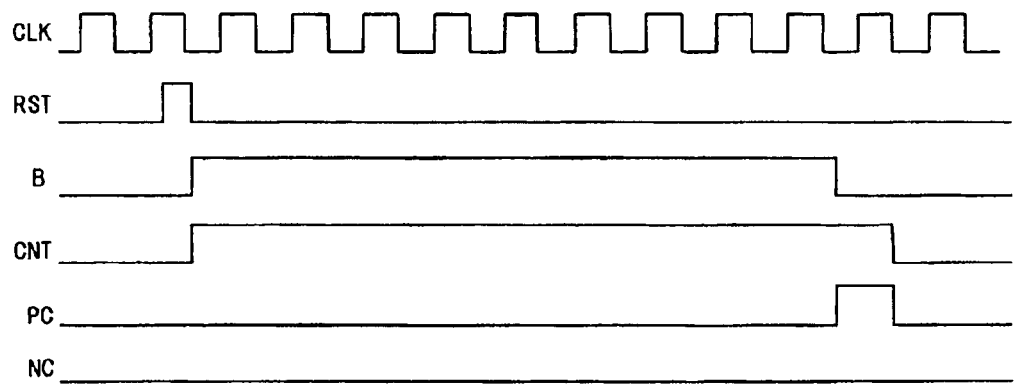
FIG. 5 is another timing chart showing an operation timing of the clock signal generation control circuit of the second embodiment.
Figure 6:
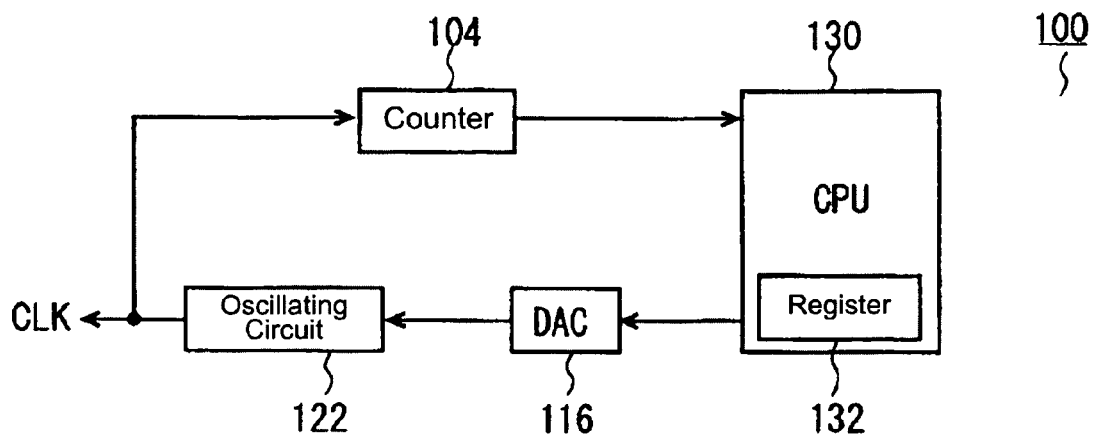
FIG. 6 is a schematic block diagram of a clock signal control circuit according to the related art.

FIGS. 4 and 5 are timing charts each showing the operation timing of the clock signal generation control circuit 50 of this embodiment. FIG. 4 shows an operation timing of the clock signal generation control circuit 50 when the frequency of the clock signal CLK is higher than a preset value. FIG. 5 shows an operation timing of the clock signal generation control circuit 50 when the frequency of the clock signal CLK is lower than a preset value.

Referring to FIG. 4, the operation timing of the clock signal generation control circuit 50 when the frequency of the clock signal CLK is higher than a preset value will be explained as follows. In the embodiment show in FIG. 4, it is assumed that the clock signal generation control circuit 50 controls so that the oscillating circuit 80 outputs a clock signal CLK having a frequency of 10 Hz. It is also assumed that the timing control circuit 56 outputs a high level timing signal B for 1 (one) second from the initiation of the count operation of the counter 54 and that the preset value stored in the frequency setting circuit 58 is "10" corresponding to the frequency of 10 Hz.

The timing control circuit 56 outputs a rest pulse as a reset signal RST to the counter 54. With this reset signal, the counter 54 returns to its initial state. Upon change of the reset signal RST from a high level signal to a low level signal, the counter 54 initiates the count down operation from the preset value as an initial value stored in the frequency setting circuit 58. At this time, the timing signal B changes from a low level signal to a high level signal. In accordance with the control of the timing control circuit 56, the switch 52 turns on and outputs the inputted clock signal CLK to the counter 54 during the time period.

The counter 54 performs count down operation in accordance with the inputted clock signal CLK. In the embodiment shown in FIG. 4, the counter 54 initiates the count down operation from the initial value of "10" and outputs a high level count control signal CNT. The counter 54 outputs a low level count control signal CNT when the count value becomes "0." In this case, since the frequency of the clock signal CLK is higher than the control target value, the time period of the high level count control signal CNT becomes shorter than the time period of the high level timing signal B.

The error detection circuit 60 outputs a high level positive side error detection signal PC based on the logic operation result of the NOT element 62 and the AND element 66 and also outputs a negative side error detection signal NC which keeps the high level from the timing when the count control signal CNT changes to a low level signal to the timing when the timing signal B changes to a low level based on the logic operation result of the NOT element 62 and the AND element 66. The frequency control circuit 70 controls the oscillating circuit 80 so that the frequency of the clock signal CLK outputted from the oscillating circuit 80 decreases by lowering the control signal based on the positive side error detection signal PC and the negative side error detection signal NC.

Next, the operation timing of the clock signal generation control circuit 50 in the case where the frequency of the clock signal CLK is lower than the preset frequency will be explained. In the embodiment show in FIG. 5, it is assumed that the clock signal generation control circuit 50 controls so that the oscillating circuit 80 outputs a clock signal CLK having a frequency of 10 Hz. It is also assumed that the timing control circuit 56 outputs a high level timing signal B for 1 (one) second from the initiation of the count operation of the counter 54 and that the preset value stored in the frequency setting circuit 58 is "10" corresponding to the frequency of 10 Hz.

The timing control circuit 56 outputs a rest pulse as a reset signal RST to the counter 54. With this reset signal, the counter 54 returns to its initial state. Upon change of the reset signal RST from a high level signal to a low level signal, the counter 54 initiates the count down operation from the preset value as an initial value stored in the frequency setting circuit 58. At this time, the timing signal B changes from a low level signal to a high level signal. In accordance with the control of the timing control circuit 56, the switch 52 turns on and outputs the inputted clock signal CLK to the counter 54 during the time period.

The counter 54 performs count down operation in accordance with the inputted clock signal CLK. In the embodiment shown in FIG. 5, the counter 54 initiates the count down operation from the initial value of "10" and outputs a high level count control signal CNT. The counter 54 outputs a low level count control signal CNT when the count value becomes "0." In this case, since the frequency of the clock signal CLK is lower than the control target value, the time period of the high level count control signal CNT becomes longer than the time period of the high level timing signal B.

The error detection circuit 60 outputs a positive side error detection signal PC which keeps the high level from the timing when the timing signal B changes to a low level signal to the timing when the count control signal CNT changes to a low level signal based on the logic operation result of the NOT element 62 and the AND element 66 and also outputs a low level negative side error detection signal NC based on the logic operation result of the NOT element 64 and the AND element 68. The frequency control circuit 70 controls the oscillating circuit 80 so that the frequency of the clock signal CLK outputted from the oscillating circuit 80 increases by increasing the control signal based on the positive side error detection signal PC and the negative side error detection signal NC.

In this second embodiment, by repeating the control operation in the case where the frequency of the clock signal CLK is higher than the preset value as shown in FIG. 4 and the control operation in the case where the frequency of the clock signal CLK is lower than the preset value as shown in FIG. 5, a clock signal CLK having a constant frequency can be outputted continuously.

In an electronic circuit system having a central processing circuit (CPU) and the clock signal generation control circuit 50 of this second embodiment, a clock signal frequency control can be performed with a high degree of accuracy without using the central processing circuit (CPU). Accordingly, in such a system having the clock signal generation control circuit 50, it becomes possible to reduce the burden of the central processing unit (CPU), thereby preventing adverse affects on operation of the entire system and enabling high precision clock signal frequency control even at a low frequency range.

The above-mentioned second embodiment is configured such that, using the switch 52 and the counter 54, the pulse number of the clock signal CLK contained in a predetermined time period (1 second) is counted. The present invention, however, is not limited to this embodiment. For example, the timing control circuit 56 can be constituted so as to output a reset signal RST and a holding signal for terminating the count operation and holding the count value to the counter 54. This invention can be exercised, without using the switch 52, by outputting the aforementioned holding signal from the timing control circuit 56.

The operation of the switch 52 and the counter 54 in the second embodiment is one example of the present invention, and the present invention is not limited to this operation. For example, it is not always required to perform the reset operation of the counter 54 immediately before the count initiation. The reset operation can be performed during a no-count operation period. Furthermore, it can be constituted such that the reset operation of the counter 54 is performed after a certain time corresponding to the predetermined number of pulses has passed from the count termination.

Furthermore, in the present invention, it can be constituted such that a clock signal CLK is inputted into a frequency dividing circuit (not illustrated) and the counter 54 counts the pulse number of the frequency-divided clock signal CLK. This enables a low speed operation of the counter 54, which does not require the use of a high-precision counter as the counter 54. This in turn can reduce the cost of the clock signal generation control circuit 50 and the system mounting the circuit 50.

In the second embodiment, the frequency control circuit 70 is constituted by the charge pump circuit (CP) 72 and the low pass filter (LPF) 74. It should be understood, however, that this is one example for executing the present invention and the present invention is not limited thereto. For example, it can be constituted such that the high level period of the positive error detection signal PC and that of the negative error detection signal NC are counted using a counter and the count value is subjected to digital-analogy conversion to create a control signal. This eliminates the use of parts, such as, e.g., a capacitor, which prevents enlargement of the entire system size.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as an non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A clock signal generation circuit, comprising:
   an oscillating circuit configured to output a clock signal having a clock frequency corresponding to a control signal;
   a counter configured to generate a count value by counting a pulse number of the clock signal outputted from the oscillating circuit during a predetermined time period;
   a subtracting circuit configured to produce differential data by subtracting the count value from a preset value previously set based on a predetermined clock frequency;
   a control signal correcting circuit configured to generate a correcting control signal by correcting a value of the control signal based on the differential data;
   a digital-analog converter circuit configured to convert the correcting control signal into an analog correcting control signal and output the converted analog correcting control signal to the oscillating circuit;
   a timing control circuit for controlling count operation of the counter, wherein the counter counts the pulse number of the clock signal within the predetermined time period in accordance with control of the timing control circuit; and
   a switch connected between the oscillating circuit and the counter, wherein the switch is configured to be on/off-controlled based on a timing signal outputted from the timing control circuit and output the clock signal inputted during an ON-state of the switch to the counter.

2. The clock signal generation circuit as recited in claim 1, wherein the timing control circuit controls initiation/termination of count operation of the counter.

3. The clock signal generation circuit as recited in claim 1, further comprising a frequency setting circuit that stores the preset value, the frequency setting circuit being connected to the subtracting circuit, wherein the subtracting circuit is configured to produce the differential data by subtracting the count value from the preset value stored in the frequency setting circuit.

4. An electronic circuit system equipped with a clock signal generation circuit, a peripheral circuit connected to the clock signal generation circuit and a central processing unit for controlling the peripheral circuit, wherein the clock signal generation circuit comprises:

an oscillating circuit configured to output a clock signal having a clock frequency corresponding to a control signal;

a counter configured to generate a count value by counting a pulse number of the clock signal outputted from the oscillating circuit during a predetermined time period;

a subtracting circuit configured to produce differential data by subtracting the count value from a preset value previously set based on a predetermined clock frequency;

a control signal correcting circuit configured to generate a correcting control signal by correcting a value of the control signal based on the differential data;

a digital-analog converter circuit configured to convert the correcting control signal into an analog correcting control signal and output the converted analog correcting control signal to the oscillating circuit;

a timing control circuit for controlling count operation of the counter; wherein the counter counts the pulse number of the clock signal within the predetermined time period in accordance with control of the timing control circuit; and a switch connected between the oscillating circuit and the counter, wherein the switch is configured to be on/off-controlled based on a timing signal outputted from the timing control circuit and output the clock signal inputted during an ON-state of the switch to the counter, whereby the clock signal generation circuit executes frequency control of the clock signal without using the central processing unit.

5. A clock signal generation control circuit to be connected to an oscillating circuit for outputting a clock signal having a clock frequency corresponding to a control signal and a frequency control circuit for generating the control signal, wherein the clock signal generation control circuit comprises:

a counter configured to count a pulse number of the clock signal outputted from the oscillating circuit during a predetermine time period and change an output level of a count control signal when a count value becomes equal to a preset value corresponding to the clock frequency;

an error detection circuit configured to detect a timing error between a timing signal indicating the predetermined time period and the count control signal and output an error detection signal; a timing control circuit configured to control count operation of the counter and output a timing signal to the error detection circuit, wherein the counter is configured to initiate counting of the pulse number of the clock signal in accordance with control of the timing control circuit; and a switch connected between the oscillating circuit and the counter, wherein the switch is configured to be on/off-controlled based on a timing signal outputted from the timing control circuit and output the clock signal inputted during an ON-state of the switch to the counter, wherein the frequency control circuit generates the control signal based on the error detection signal.

6. The clock signal generation control circuit as recited in claim 5, further comprising a frequency setting circuit connected to the counter, the frequency setting circuit storing the preset value, wherein the counter is configured to output the count control signal when the count value becomes equal to the preset value.

7. The clock signal generation control circuit as recited in claim 6, wherein the counter initiates countdown operation starting from the preset value as the starting value stored in the frequency setting circuit, and outputs the count control signal when a countdown value becomes "0".

8. The clock signal generation control circuit as recited in claim 5, wherein the oscillating circuit is a circuit equipped with a voltage-controlled oscillator.

9. The clock signal generation control circuit as recited in claim 5, wherein the timing control circuit controls initiation/termination of count operation of the counter.

10. The clock signal generation control circuit as recited in claim 5, wherein the frequency control circuit generates the control signal for controlling the clock frequency of the clock signal generated by the oscillating circuit, based on the error detection signal outputted from the error detection circuit, and outputs the control signal to the oscillating circuit.

11. The clock signal generation control circuit as recited in claim 5, wherein the frequency control circuit comprises a charge pump circuit and a low pass filter.

12. An electrical circuit system equipped with a clock signal generation circuit including a clock signal generation control circuit, a peripheral circuit connected to the clock signal generation circuit and a central processing unit for controlling the peripheral circuit, wherein the clock signal generation control circuit is connected to an oscillating circuit for outputting a clock signal having a clock frequency in accordance with a control signal and a frequency control circuit for generating the control signal, wherein the clock signal generation control circuit comprises:

a counter configured to count a pulse number of the clock signal outputted from the oscillating circuit in a predetermine time period and change an output level of a count control signal when the counted value becomes equal to a preset value corresponding to the clock frequency;

an error detection circuit configured to detect a timing error between a timing signal indicating the predetermine time period and the count control signal and output an error detection signal;

a timing control circuit configured to control count operation of the counter and output a timing signal to the error detection circuit, wherein the counter is configured to initiate counting of the pulse number of the clock signal in accordance with control of the timing control circuit; and a switch connected between the oscillating circuit and the counter, wherein the switch is configured to be on/off-controlled based on a timing signal outputted from the timing control circuit and output the clock signal inputted during an ON-state of the switch to the counter, wherein the frequency control circuit generates the control signal based on the error detection signal, whereby the clock signal generation control circuit executes frequency control of the clock signal without using the central processing unit.

* * * * *